United States Patent
Cartagena et al.

(10) Patent No.: US 10,615,799 B1
(45) Date of Patent: Apr. 7, 2020

(54) CIRCUIT TO MITIGATE SINGLE EVENT UPSET PERTURBATION IN A DIRECT CURRENT TO DIRECT CURRENT CONVERTER

(71) Applicant: Naval Information Warfare Center Pacific, San Diego, CA (US)

(72) Inventors: Eric N. Cartagena, San Diego, CA (US); Henry D. Ngo, San Diego, CA (US); Jener S. Chang, San Diego, CA (US)

(73) Assignee: United States of America represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/388,262

(22) Filed: Apr. 18, 2019

(51) Int. Cl.
*H03K 19/20* (2006.01)
*H03K 19/173* (2006.01)
*H02M 3/156* (2006.01)

(52) U.S. Cl.
CPC ........ *H03K 19/1737* (2013.01); *H02M 3/156* (2013.01); *H03K 19/20* (2013.01)

(58) Field of Classification Search
CPC ........... H03K 17/08; H03K 2017/0803; H03K 19/173; H03K 19/1733; H03K 19/1737; H03K 19/20
See application file for complete search history.

(56) References Cited

U.S. PATENT DOCUMENTS

| | | | | |
|---|---|---|---|---|
| 6,504,411 B2 * | 1/2003 | Cartagena | ............ | H03K 3/0375 327/199 |
| 7,215,581 B2 * | 5/2007 | Lotz | ..................... | H03K 3/0375 326/10 |
| 9,543,959 B1 * | 1/2017 | Carmean | .............. | H03K 19/195 |
| 2015/0028919 A1 * | 1/2015 | Ning | ..................... | H03K 19/007 326/9 |
| 2016/0182056 A1 * | 6/2016 | Mumper | .............. | H03K 21/026 327/115 |
| 2017/0324413 A1 * | 11/2017 | Hwang | .......... | H03K 19/018521 |
| 2019/0243408 A1 * | 8/2019 | Bai | ......................... | H03L 7/087 |
| 2019/0288652 A1 * | 9/2019 | Tsao | ......................... | H03F 1/32 |

OTHER PUBLICATIONS

Martin, Mark E., "Design and Characterization of a Radiation Tolerant Triple Mode Redundant Sense Amplifier Flip-Flop for Space Applications", Master's Thesis at Air Force Institute of Technology, Wright-Patterson AFB, Mar. 2006.

* cited by examiner

*Primary Examiner* — Jason Crawford
(74) *Attorney, Agent, or Firm* — Naval Information Warfare Center, Pacific; Kyle Eppele; Young Fei

(57) ABSTRACT

A logic circuit for preventing false signals generated by radiation particle hits on sensitive nodes the circuit, comprising a first logic gate coupled to a third logic gate, a second logic gate coupled to the third logic gate, a multiplexer coupled to the third logic gate, an inverter coupled to the multiplexer, a pulldown transistor coupled to the first logic gate, and a latch coupled to the pulldown transistor. The first logic gate is coupled to the second logic gate, the pulldown transistor, and the latch. The second logic gate is coupled to the pulldown transistor and latch. The latch is coupled to the third logic gate and multiplexer. The multiplexer is coupled to the first logic gate and coupled to the second logic gate. The third logic gate outputs a high output signal only if both the first logic gate and second logic gate outputs the high output signal.

9 Claims, 3 Drawing Sheets

CIRCUIT TO MITIGATE SINGLE EVENT UPSET PERTURBATION IN A DIRECT CURRENT TO DIRECT CURRENT CONVERTER

FEDERALLY SPONSORED RESEARCH AND DEVELOPMENT

The Circuit to Mitigate Single Event Upset Perturbation in a Direct Current to Direct Current Converter is assigned to the United States Government and is available for licensing and commercial purposes. Licensing and technical inquiries may be directed to the Office of Research and Technical Applications, Naval Information Warfare Center Pacific (Code 72120), San Diego, Calif., 92152 via telephone at (619) 553-5118 or email at ssc_pac_t2@navy.mil. Reference Navy Case 103961.

FIELD OF THE INVENTION

The present invention relates to circuits generally, and circuits preventing false signals generated by radiation particle hits on sensitive nodes in a circuit from disrupting overall circuit operations or upsetting the circuit specifically.

DESCRIPTION OF THE RELATED ART

There are very energetic heavy ion components of the cosmic ray flux in the space environment within the solar system. There are also alpha particles which are the decay products of naturally occurring radioactive heavy actinides within the solar system. These particles can produce errors in sensitive electronic circuits by ionizing the device and circuit materials as the particles transit through the devices. These errors can produce false states in sensitive electronics that, when translated, can produce inaccurate information. In some cases, where this false information is provided to critical systems, the false states can be catastrophic. Methods such as Triple Mode Redundancy (TMR) and components such as hardened latches and DICE latches may be able to mitigate these upsets in certain cases, but TMR cannot be implemented for DC-DC converter control logic.

SUMMARY OF THE INVENTION

The present invention is a logic circuit for preventing false signals generated by radiation particle hits on sensitive nodes the circuit. The logic circuit comprises a first logic gate coupled to a third logic gate, a second logic gate coupled to the third logic gate, a multiplexer coupled to the third logic gate, an inverter coupled to the multiplexer, a pulldown transistor coupled to the first logic gate, and a latch coupled to the pulldown transistor. The first logic gate is coupled to the second logic gate, the pulldown transistor, and the latch. The second logic gate is coupled to the pulldown transistor and coupled to the latch. The latch is coupled to the third logic gate and coupled to the multiplexer. The multiplexer is coupled to the first logic gate and coupled to the second logic gate. The third logic gate outputs a high output signal only if both the first logic gate and second logic gate outputs the high output signal.

In one embodiment of the present invention, the first logic gate is an OR gate, the second logic gate is an OR gate, the third logic gate is an AND gate, and the latch is a DICE latch.

In another embodiment of the present invention, the first logic gate is an OR gate, the second logic gate is an NOR gate, the third logic gate is a NAND gate, and the latch is a DICE latch.

BRIEF DESCRIPTION OF THE DRAWINGS

Throughout the several views, like elements are referenced using like elements. The elements in the figures are not drawn to scale, and some dimensions may be exaggerated for clarity.

DETAILED DESCRIPTION OF THE INVENTION

While this invention may be embodied in different forms, the drawings and this section describe in detail specific embodiments of the invention with the understanding that the present disclosure is to be considered merely a preferred embodiment of the invention, and is not intended to limit the invention in any way.

Figure 1:
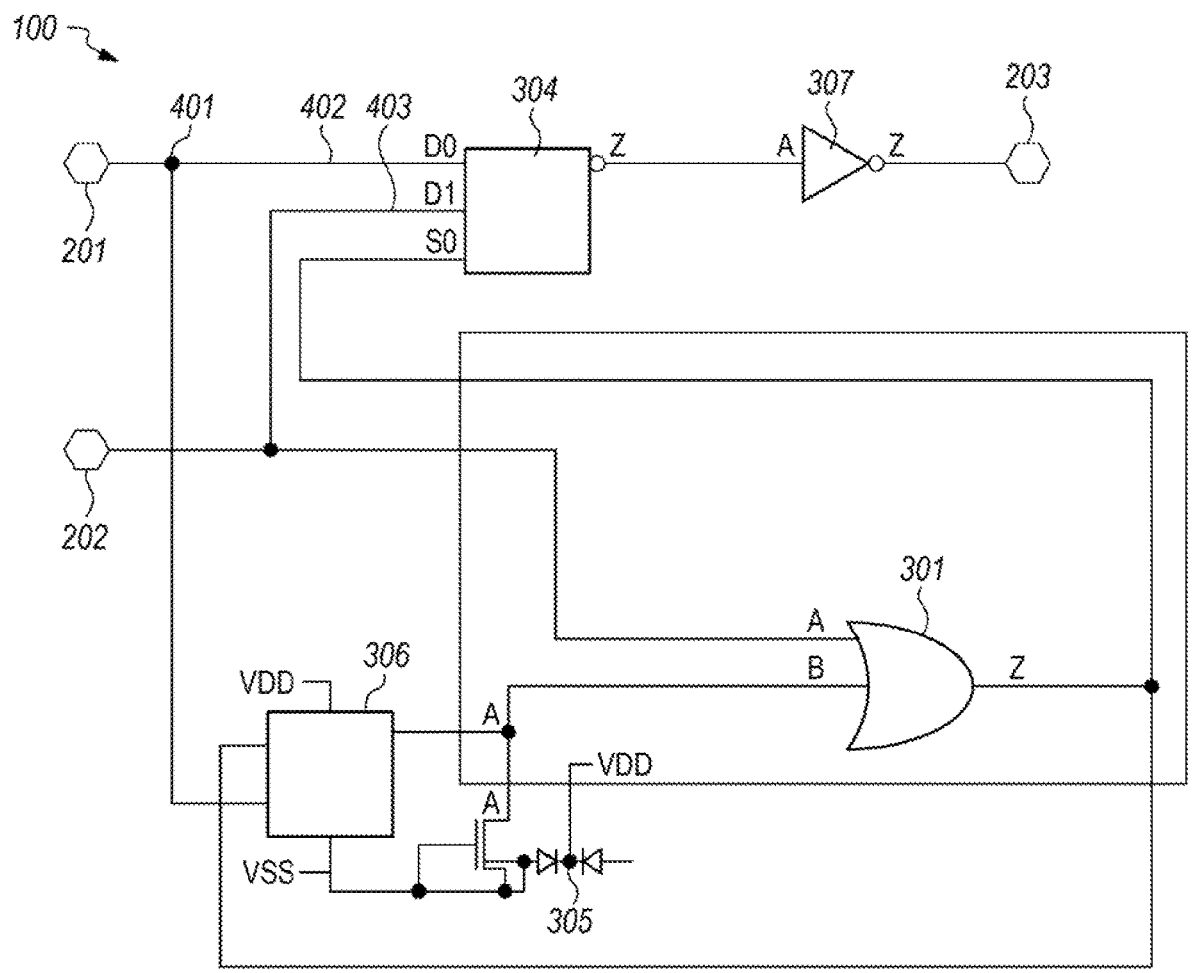
FIG. 1 is a circuit block diagram of a baseline circuit architecture, which can be used to facilitate an understanding of the present invention.

FIG. 1 depicts a baseline logic circuit 110 architecture which can be used to facilitate an understanding of the present invention. The baseline logic circuit 110 is a logical switch that selects between an internally driven signal 201 (corresponding with an internal clock signal) and an externally driven signal 202 (corresponding with an external clock signal) via a first logic gate 301. The baseline logic circuit 110 comprises a first logic gate 301 (which is an OR gate), multiplexer 304, pulldown transistor 305, latch 306 (which can be a DICE latch), and inverter 307. The wiring of the components in the baseline logic circuit 110 is depicted in FIG. 1. Functionally, the output of the first logic gate 301 goes into a multiplexer 304, which selects between the internally driven signal 201 and externally driven signal 202. The internally driven signal 201 is fed to the multiplexer 304 via the first channel 402 (the D0 channel). The externally driven signal 202 is fed to the multiplexer 304 via the second channel 403 (the D1 channel). The selected signal is output from the multiplexer 304 and through the inverter 307 as the output signal 203. The signal is initially pulled down via the pulldown transistor 305, which can be a TN500 pulldown transistor. If the multiplexer 304 selects the first channel 402 as its input (D0), then the output signal 203 will be low. The first channel is the internal clock signal from the internally driven signal 01. If the external clock signal from the externally driven signal 202 goes high however, then the first logic gate 301 will output a high signal. This high signal causes the output of the latch 306 to go high on the next clock cycle, forcing the multiplexer 304 to select the second channel 403, which is the external clock signal from the externally driven signal 202. Restated, if the externally driven signal 202 is low, then the multiplexer selector is low and will stay low the entire time. However, if the externally driven signal 202 is high, then a high with latch in and the multiplexer selector will stay high.

However, if the baseline logic circuit 110 is operates in a highly energetic ion heavy environment (such as in space within the solar system), a strike on the output transistors in the first logic gate 301 could cause the external clock signal from the externally driven signal 202 to be incorrectly selected, erroneously driving the output signal 203 high. If there is no signal on the external clock pin feeding the externally driven signal 202 however, then the entire circuit could fail and become non-functional. The present invention mitigates this catastrophic condition.

Figure 2:
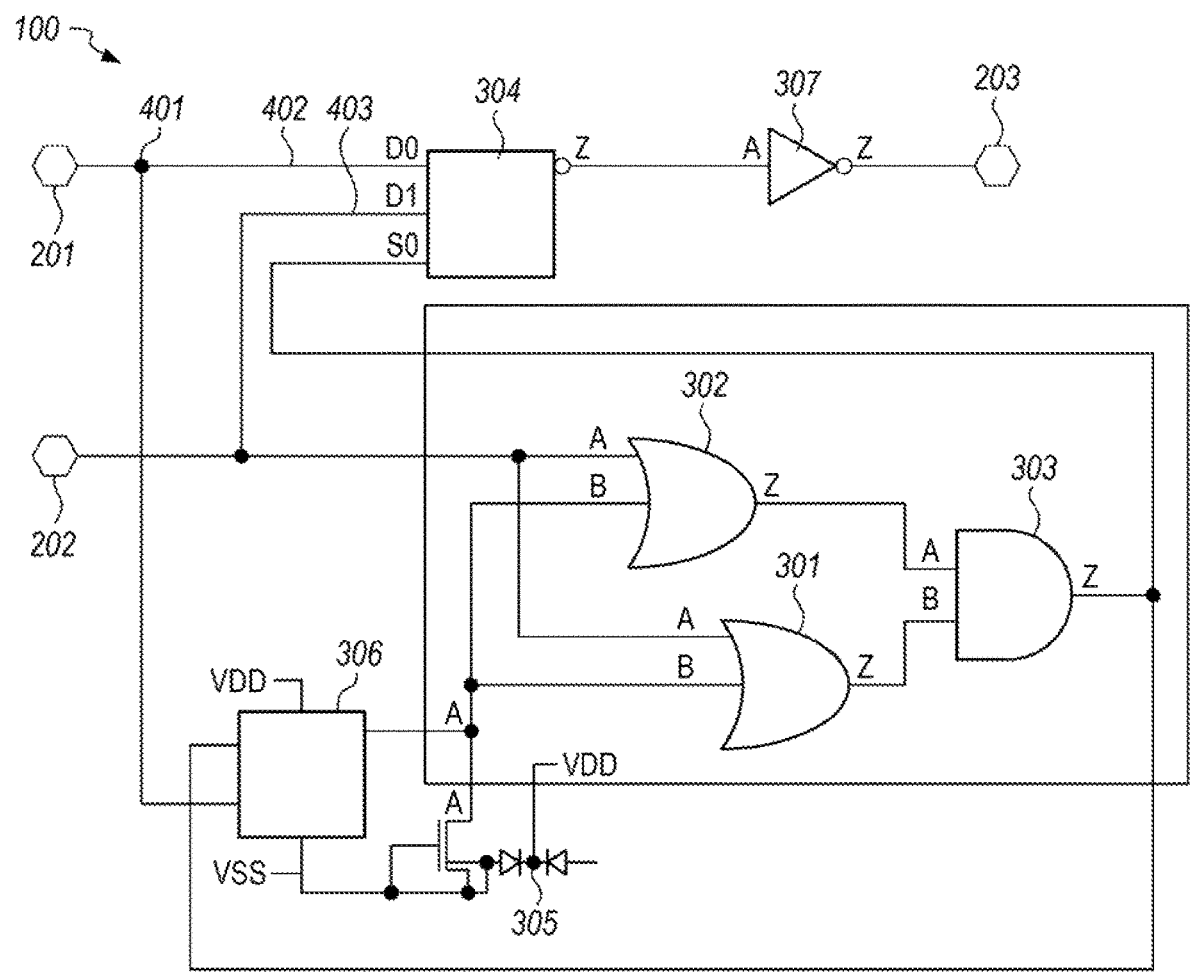
FIG. 2 is a circuit block diagram of an embodiment of the present invention.

FIG. 2 depicts an embodiment of the present inventive logic circuit 120. The present inventive logic circuit 120 comprises the addition of a redundant logical gate path to the baseline logic circuit 110. The inventive logic circuit 120 comprises an additional second logic gate 302 and third logic gate 303, which are wired as depicted in FIG. 2. In this embodiment, the second logic gate 302 is an OR gate and the third logic gate 303 is an AND gate. Either the first logic gate 301 or second logic gate can be disrupted by an ion strike, but the logical function of the third logic gate 303 would prevent the output signal 203 from being disturbed. That is, the AND functionality of the third logic gate 303 returns a high signal only in the case where both the first logic gate 301 and second logic gate 302 return high signals. Where one of the first logic gate 301 or second logic gate 302 returns an erroneous high signal, the third logic gate 303 will not return an erroneous high signal.

Figure 3:
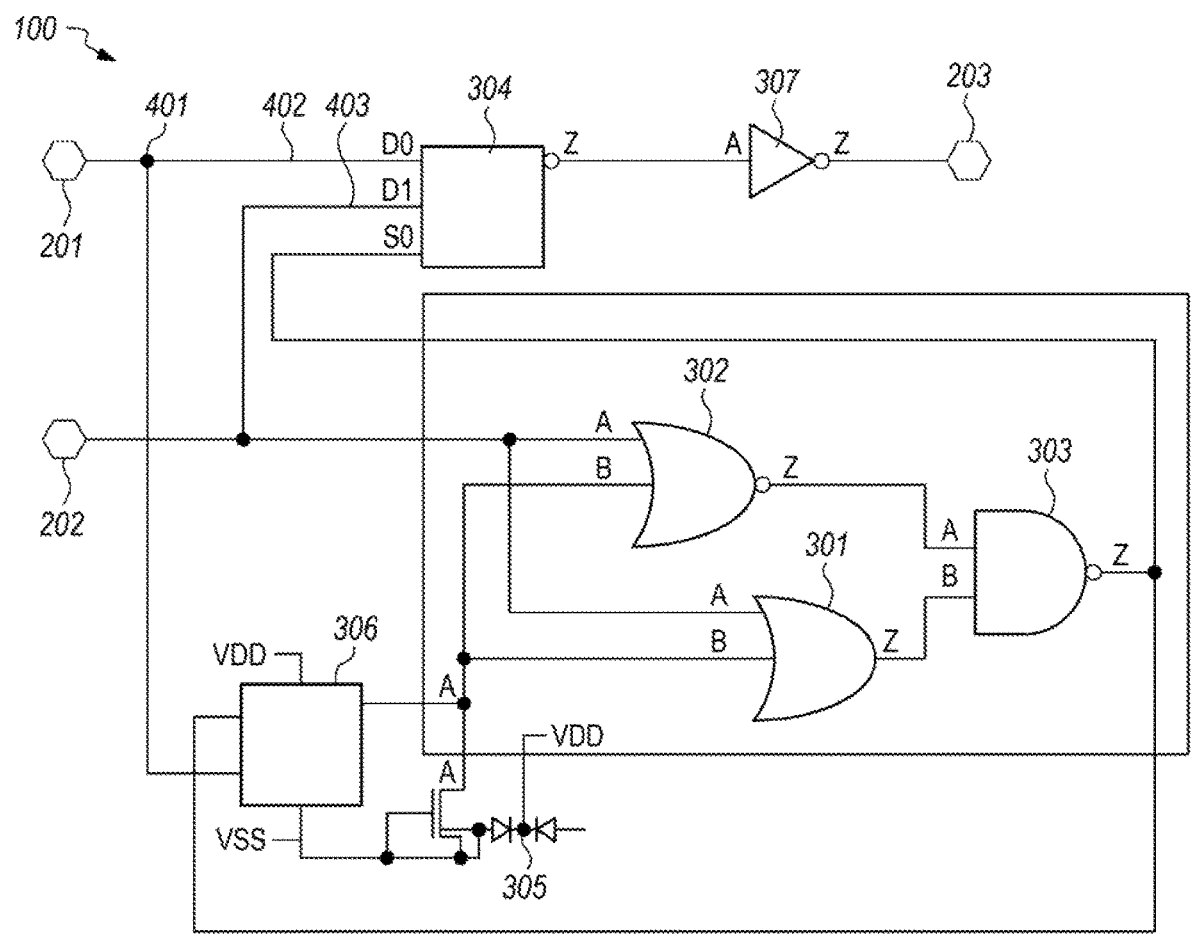
FIG. 3 is a circuit block diagram of an embodiment of the present invention.

FIG. 3 depicts an alternative embodiment of the inventive logic circuit 120. The second logic gate 302 can be a NOR gate if the third logic gate 303 is a NAND gate. The inverter 307 is removed from this embodiment. In this embodiment, the only condition under which the third logic gate 303 returns a low signal is where both the first logic gate 301 and second logic gate 302 go high.

The present inventive logic circuit 120 is advantageous for being compact and adding only two additional components to the baseline logic circuit 110. By taking up less space, the probability of a heavy ion particle strike through the sensitive node is greatly reduced.

From the above description of the present invention, it is manifest that various techniques may be used for implementing its concepts without departing from the scope of the claims. The described embodiments are to be considered in all respects as illustrative and not restrictive. The method disclosed herein may be practiced in the absence of any element that is not specifically claimed. It should also be understood that the present invention is not limited to the particular embodiments described herein, but is capable of being practiced in many embodiments without departure from the scope of the claims.

What is claimed is:

1. A logic circuit comprising:
a first logic gate coupled to a third logic gate;
a second logic gate coupled to the third logic gate;
a multiplexer coupled to the third logic gate;
an inverter coupled to the multiplexer;
a pulldown transistor coupled to the first logic gate;
a latch coupled to the pulldown transistor;
wherein the first logic gate is coupled to the second logic gate, wherein the first logic gate is coupled to the pulldown transistor, wherein the first logic gate is coupled to the latch, wherein the second logic gate is coupled to the pulldown transistor, wherein the second logic gate is coupled to the latch, wherein the latch is coupled to the third logic gate, wherein the latch is coupled to the multiplexer, wherein the multiplexer is coupled to the first logic gate, wherein the multiplexer is coupled to the second logic gate; and
wherein the third logic gate outputs a high output signal only if both the first logic gate and second logic gate output said high output signal.

2. The logic circuit of claim 1, wherein the first logic gate is an OR gate.

3. The logic circuit of claim 1, wherein the second logic gate is an OR gate.

4. The logic circuit of claim 1, wherein the third logic gate is an AND gate.

5. The logic circuit of claim 1, wherein the latch is a DICE latch.

6. A logic circuit comprising:
a first logic gate coupled to a third logic gate;
a second logic gate coupled to the third logic gate;
a multiplexer coupled to the third logic gate;
an inverter coupled to the multiplexer;
a pulldown transistor coupled to the first logic gate;
a latch coupled to the pulldown transistor;
wherein the first logic gate is coupled to the second logic gate, wherein the first logic gate is coupled to the pulldown transistor, wherein the first logic gate is coupled to the latch, wherein the second logic gate is coupled to the pulldown transistor, wherein the second logic gate is coupled to the latch, wherein the latch is coupled to the third logic gate, wherein the latch is coupled to the multiplexer, wherein the multiplexer is coupled to the first logic gate, wherein the multiplexer is coupled to the second logic gate; and
wherein the first logic gate is an OR gate, wherein the second logic gate is an OR gate, wherein the third logic gate is an AND gate.

7. The logic circuit of claim 6, wherein the latch is a DICE latch.

8. A logic circuit comprising:
a first logic gate coupled to a third logic gate;
a second logic gate coupled to the third logic gate;
a multiplexer coupled to the third logic gate;
a pulldown transistor coupled to the first logic gate;
a latch coupled to the pulldown transistor;
wherein the first logic gate is coupled to the second logic gate, wherein the first logic gate is coupled to the pulldown transistor, wherein the first logic gate is coupled to the latch, wherein the second logic gate is coupled to the pulldown transistor, wherein the second logic gate is coupled to the latch, wherein the latch is coupled to the third logic gate, wherein the latch is coupled to the multiplexer, wherein the multiplexer is coupled to the first logic gate, wherein the multiplexer is coupled to the second logic gate; and
wherein the first logic gate is an OR gate, wherein the second logic gate is an NOR gate, wherein the third logic gate is an NAND gate.

9. The logic circuit of claim 8, wherein the latch is a DICE latch.

* * * * *